United States Patent
Temple et al.

(10) Patent No.: US 7,692,211 B1
(45) Date of Patent: Apr. 6, 2010

(54) SUPER GTO-BASED POWER BLOCKS

(75) Inventors: Vic Temple, Clifton Park, NY (US);
Forrest Holroyd, Duanesburg, NY (US);
Sabih Al-Marayati, Sunland, CA (US);
Deva Pattanayak, Cupertino, CA (US)

(73) Assignee: Silicon Power Corporation, Exton, PA (US)

( * ) Notice: Subject to any disclaimer, the term of this patent is extended or adjusted under 35 U.S.C. 154(b) by 0 days.

(21) Appl. No.: 09/968,615

(22) Filed: Oct. 2, 2001

Related U.S. Application Data

(60) Provisional application No. 60/302,386, filed on Jul. 3, 2001.

(51) Int. Cl.
*H01L 29/74* (2006.01)

(52) U.S. Cl. .................. 257/150; 257/138; 257/147; 257/149; 257/152

(58) Field of Classification Search .................. 257/138, 257/147–153, 163–172
See application file for complete search history.

(56) References Cited

U.S. PATENT DOCUMENTS

| | | | |
|---|---|---|---|
| 4,242,690 A | 12/1980 | Temple | |
| 4,374,389 A | 2/1983 | Temple | |
| 4,648,174 A | 3/1987 | Temple et al. | |
| 4,742,382 A * | 5/1988 | Jaecklin | 257/127 |
| 4,927,772 A | 5/1990 | Arthur et al. | |
| 5,028,987 A | 7/1991 | Neugebauer et al. | |
| 5,103,290 A | 4/1992 | Temple et al. | |
| 5,105,536 A | 4/1992 | Neugebauer et al. | |
| 5,135,890 A | 8/1992 | Temple et al. | |

(Continued)

OTHER PUBLICATIONS

Victor Temple, Thinpak Technology Shrinks Power Modules, Power Hybrids and Ultra-High Speed Switching Devices, PCIM, May 2000, pp. 1-5.

*Primary Examiner*—Ori Nadav
(74) *Attorney, Agent, or Firm*—Blank Rome LLP

(57) ABSTRACT

A gate turn-off thyristor (GTO) device has a lower portion, an upper portion and a lid. The lower portion has a lower base region of a first conductivity type, and a lower emitter region of a second conductivity type disposed at or from a lower surface of the lower base region. A lower junction is formed between the lower base region and the lower emitter region. The upper portion has an upper base region of the second conductivity type, and upper emitter regions of the first conductivity type disposed at or from an upper surface of the upper base region. An upper-lower junction is formed between the lower base region and the upper base region, and upper junctions are formed between the upper base region and the upper emitter regions. The upper base region and upper emitter regions form an upper base surface with first conductive contacts to the upper base region alternating with second conductive contacts to the upper emitter regions. The lid has a layer of insulator with upper and lower surfaces. Upper metal stripes extend along the upper surface of the insulator, and lower metal stripes extend along the lower surface of the insulator. The upper and lower metal stripes are connected together by vias that extend through the insulator. One set of the lower metal stripes contacts the first conductive contacts, but not the second conductive contacts. Another set of the lower metal stripes contacts the second conductive contacts, but not the first conductive contacts.

51 Claims, 9 Drawing Sheets

U.S. PATENT DOCUMENTS

| | | |
|---|---|---|
| 5,139,972 A | 8/1992 | Neugebauer et al. |
| 5,166,773 A | 11/1992 | Temple et al. |
| 5,168,333 A * | 12/1992 | Nakagawa et al. .......... 257/135 |
| 5,184,206 A | 2/1993 | Neugebauer et al. |
| 5,206,186 A | 4/1993 | Neugebauer et al. |
| 5,209,390 A | 5/1993 | Temple et al. |
| 5,220,197 A | 6/1993 | Schovanec |
| 5,248,901 A | 9/1993 | Temple |
| 5,304,847 A | 4/1994 | Neugebauer et al. |
| 5,366,932 A | 11/1994 | Temple |
| 5,446,316 A | 8/1995 | Temple et al. |
| 5,473,193 A | 12/1995 | Temple et al. |
| 5,497,013 A | 3/1996 | Temple |
| 5,521,436 A | 5/1996 | Temple |
| 5,532,635 A | 7/1996 | Watrous et al. |
| 5,569,957 A | 10/1996 | McLean |
| 5,577,656 A | 11/1996 | Temple et al. |
| 5,585,310 A | 12/1996 | Temple |
| 5,686,768 A | 11/1997 | Thomsen et al. |
| 5,757,037 A | 5/1998 | Piccone et al. |
| 5,825,090 A | 10/1998 | Piccone |
| 6,057,612 A | 5/2000 | Temple |
| 2001/0026840 A1 | 10/2001 | Ozmat et al. ................ 427/250 |

* cited by examiner

SUPER GTO-BASED POWER BLOCKS

The present invention claims the benefit of U.S. Provisional Application No. 60/302,386 filed Jul. 3, 2001, whose disclosure is hereby incorporated by reference in its entirety.

BACKGROUND OF THE INVENTION

1. Field of the Invention

The invention relates to a gate turn-off thyristor having uniform current, low impedance and ultra-low gate impedance differential to all parts of the device.

2. Description of the Related Art

Conventional Gate Turn-off thyristors (GTO) are made with large feature sizes and emitters that are defined by deep silicon etches. Those GTOs are designed to accommodate large gate currents that flow in the gate metalization in turn-off and so that the gates are not shorted to the cathode when packaged in the standard hockey puck (or PressPak) package. Advanced GTOs having fine linewidths can be made in modern wafer fabrication facilities. However, providing low inductance and resistance gate contacts to all parts of the devices has not been previously shown as is done in the present invention.

High voltage GTO or SCR based systems are expensive due to package and assembly costs and the cost of gate drives. In addition, those high voltage GTO or SCR based systems have only marginal device performance. The packages are large, must be clamped at thousands of pounds of pressure, and have large inductances. Even though the devices can be cooled on two sides, that cooling is greatly degraded because the heat conducts across several dry interfaces. Due to the cost and yield of silicon, high voltage thyristor structures are used for the largest current and highest voltage applications.

PressPak packaging is difficult and expensive to effectively combine MOS-type devices with GTOs, especially where parasitic gate inductance and resistance are key to performance. One packaging alternative is to modify the power module in their high power IGBT modules. One technique presently used to build high-current and high-voltage IGBTs (Insulated Gate Bipolar Transistors) is to attach the bottom surfaces of many discrete IGBT chips in parallel on a common collector electrode on a heat sink, and to attach parallel gate and emitter electrodes to their top surfaces, using wire bonding or soldered electrodes, and to assemble these into a larger module package.

Another technique is to begin with many small devices, each already assembled in its own small package, and to connect these in parallel in a larger module package. In those packages, thermal resistance is approximately the same as for the PressPak package. Dry interfaces are eliminated, a thinner path is provided to the heat sink, and the heat source is distributed, i.e., there are several parallel die. However, one-sided cooling is provided, which is not as effective as two-sided cooling. Nonetheless, an overall lower thermal impedance is achieved over the PressPak packaging.

An example of the PressPak packaging is shown, for instance, in FIG. 1. The device is a monolithic full silicon wafer, rather than a number of discrete individual chips in parallel. The silicon wafer may be in the range of 25 to 40 mils thick and 2-6 inches in diameter. This wafer is hard-soldered or brazed to a refractory metal such as tungsten or molybdenum which has a coefficient of thermal expansion close to that of silicon, with a thickness of around 100 mils and a diameter just slightly larger than that of the silicon wafer. The silicon-plus-metal disc is then placed between two copper pole-pieces that provide electrical and thermal contact to both sides of the disc. The pole pieces that press against the disc are flat and polished, and are firmly held together by an electrically insulating structure, so they press toward each other, against opposite sides of the disc with high pressure to assure good thermal contact.

ThinPak technology is a power semiconductor packaging technique developed by Silicon Power Corporation. The ThinPak packaging technique eliminates wire bonds, results in near 100% power module yields, reduces parasitics by an order of magnitude, and simplifies module manufacturing so that it can be automated as a simple pick and place operation.

Present GTO devices have large feature size, primarily due to the need for a high current gate that is formed by etching into silicon about 10-15 microns. When the pole piece is clamped to the top surface, the emitter fingers are contacted while the recessed gate is brought out to an external gate contact. GTO finger width is typically 25 mils (or about 600 microns), and finger length is about 200 mils.

GTOs have been made having a turn-off effected by discrete FET chips packaged inside a PressPak packaged GTO which are gated to effectively short the GTO gate and cathode. Both 53 and 77 mm devices have been produced with voltages as high as 9000 volts. This greatly reduces the cost and size of the turn-off gate drive. Compared to an MCT, in which the FET is built into every cell, a larger area die than a MOS gated device is achieved. A high voltage MOS gated device is obtained without taking all of the silicon through both the FET and the HV GTO processes.

In principle, a sufficient number of FETs can be paralleled to turn off any current. In practice, however, the amount of current that can be turned off is governed by the worst GTO finger-to-gate FET circuit inductance, which, for a high performance device, must be in the nano-henry gate inductance range and the sub-nanohenry gate differential inductance region. If the inductance can be made to approach zero, then the turn-off is dominated by 1) GTO finger current uniformity, and 2) the finger width and upper base sheet resistance under the GTO fingers. Finger sizes of the order of those found in planar transistors, (i.e., instead of 20 to 30 mil finger repeat distances 2 to 3 mils) have been used to increase the theoretical maximum current that can be turned off. The difficulty here is that this small geometry is not compatible with the traditional close tube approach in which the fingers are defined by a deep etch and the cathode pressure contacted.

Another shortcoming of the conventional devices is that they do not interdigitate high current gate and cathode contacts with very small (microns) separation. Yet another problem is that they cannot achieve a stable, high voltage breakdown voltage without the normal deep, closed tube diffusion. A GTO and bipolar transistor is needed that can be made with planar geometries and MOSFET-like cell sizes that are packaged to allow high current contacts to die areas as small as several mils on a side equally well to both gate and cathode in a GTO or emitter in a transistor.

SUMMARY OF THE INVENTION

It is therefore an object of the invention to provide a highly interdigitated GTO-lid combination that provides low inductance gate-cathode impedance that also minimizes differential gate-cathode inductance in all parts of the GTO.

It is further an objective to pattern the emitter fingers such that current will be prevented from concentrating in a small portion of an emitter finger during turn-off.

It is a further objective to utilize the top surface of the lid to mount at least part of the turn-off gate drive circuit to minimize inductance.

It is a further objective to combine thinPak GTO devices in power blocks that combine a super GTO and/or a super SCR with MCTs (MOS Controlled Thyristors) and turn-off power FETs. It is another object of the invention to provide a power block that minimizes control complexity, power, size and cost. It is yet another object of the invention to provide a GTO that can maximize the amount of current that the GTO can interrupt without being damaged, and can turn off at least 100 A/cm$^2$.

The present invention is a gate turn-off thyristor (GTO) device having a lower portion and an upper portion. The lower portion has a lower base region of a first conductivity type, a lower emitter region of a second conductivity type deposed at or from a lower surface of the lower base region. A lower junction is formed between the lower base region and the lower emitter region. The upper portion has an upper base region of the second conductivity type, upper emitter regions of the first conductivity type disposed at or from an upper surface of the upper base region. Upper junctions are formed between the upper base region and the upper emitter regions to enable the turn-on and turn-off of high current.

The upper base region and upper emitter regions are arranged to form an upper surface having conductive contacts to the upper base regions, alternating with conductive contacts to the upper emitter regions. An upper-lower junction is also formed between said lower portion and said upper portion, to enable the device to support a high voltage without flow of current. The lower junction, upper junction and upper-lower junctions form a junction series through which forward current can flow in a latched-on condition, or through which current flow can be prevented in an off, or blocking, condition.

A lid is also provided having a layer of insulator with upper and lower surfaces. Upper metal stripes extend along the upper surface of the insulator, and lower metal stripes extend along the lower surface of the insulator. One set of the lower metal stripes contacts the upper base conductive contacts, but not the upper emitter conductive contacts. Another set of the lower metal stripes contacts the upper emitter conductive contacts, but not the upper base conductive contacts. The lid also has conductive vias that connect the upper metal stripes with the lower metal stripes. The upper junction, upper base surface, conductive contacts and vias enhance current flow uniformity and minimize inductance.

The power blocks of the present invention provide approximately three times the performance of the traditional GTO with the added value of MOS controlled turn-on and turn-off, and are significantly cheaper to manufacture.

DESCRIPTION OF THE PREFERRED EMBODIMENTS

In describing the preferred embodiments of the invention, specific terminology will be resorted to for the sake of clarity. However, the invention is not intended to be limited to the specific terms so selected.

Figure 1:
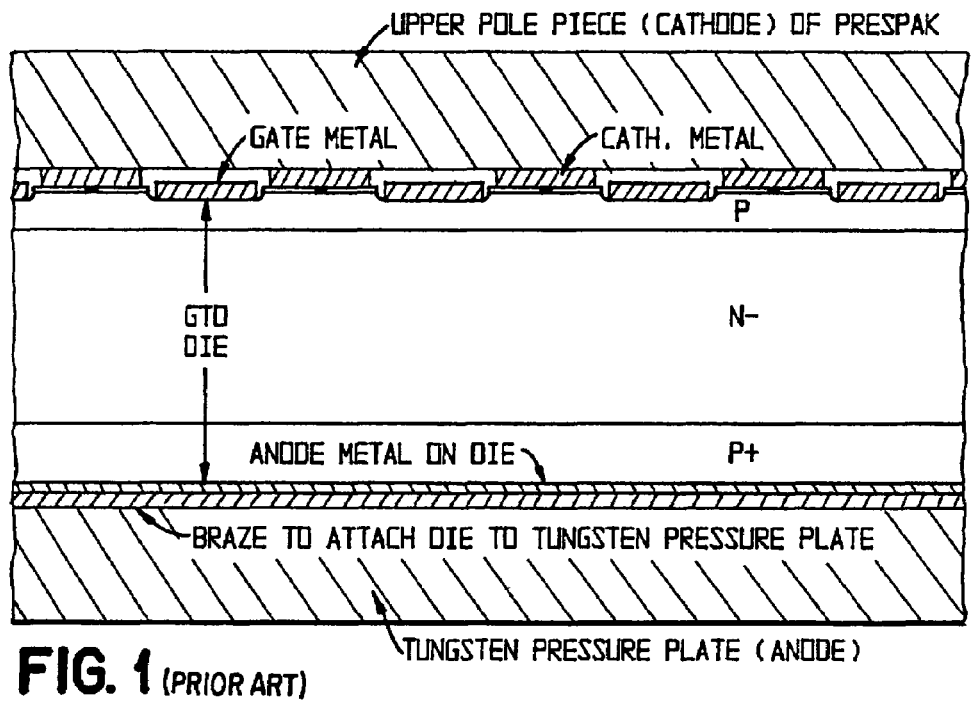
FIG. 1 is a cross-section of a conventional GTO die with PressPak packaging.
Figure 2:
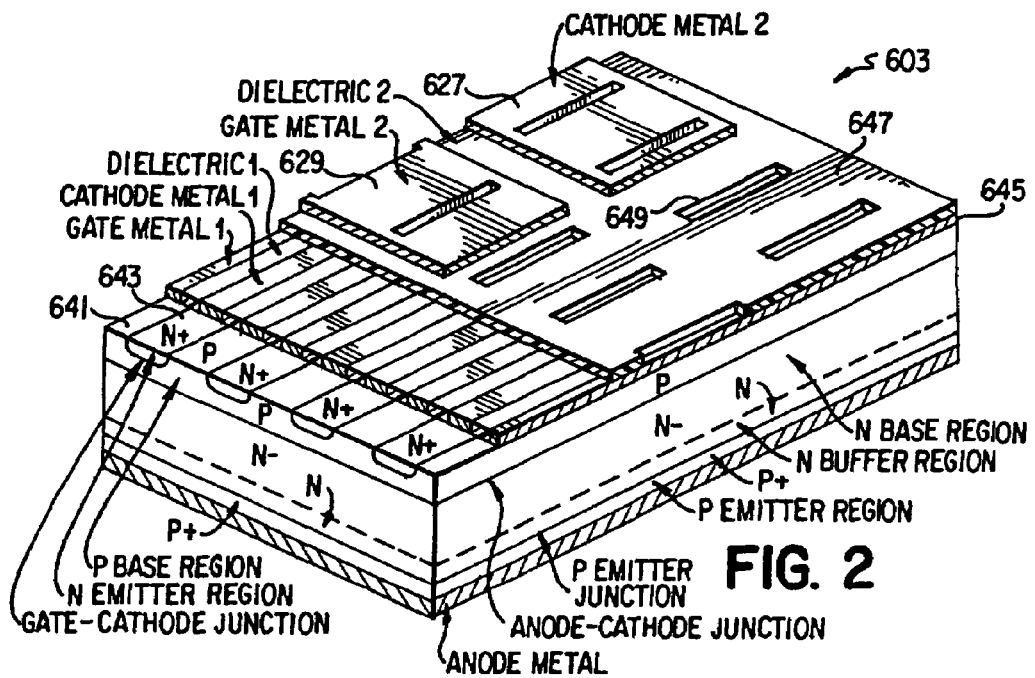
FIG. 2 is an isometric view of a GTO die in accordance with a first embodiment of the invention, having layers cut away for illustrative purposes.

Turning next to FIG. 2, a first embodiment of the GTO die 603 is shown. The GTO 603 includes an anode metal layer, (P+) emitter region, (N) buffer region, (N−) base region, and a (P) base region 641 having (N+) emitter region channels 643 extending parallel to one another.

A differential inductance occurs between the (N+) region 643 and the (P) region 641. The present invention minimizes the differential induction to less than about 0.01 of the total inductance. A uniform current is provided, which depends upon finger width and resistance, to achieve a low total inductance and a uniform inductance. In addition, the (N+) emitter 643 has a repeating pattern along the cell of good and moderate injection regions of turn off capability. This pattern minimizes overall impedance, by forming filaments in many locations to diffuse the current.

In this manner, the current doesn't form at one spot during turn off, which could vaporize that area. Instead, by providing good and moderate injection regions of turn off capability, turn off is diffused to many locations of smaller current. The pattern could be, for instance, that the (N+) emitter 643 not be a single elongated region, but instead be multiple shorter regions that are interrupted by the (P) region 641. The pattern of the (N+) region 643 could also be a continuous elongated region having an hourglass shape having areas with larger cross-section area and pinched areas with a smaller cross-section area. The pinched areas have a moderate turn off capability and the larger cross-section areas have good turn off capability. The current will then turn off first at the areas of moderate turn off capability.

An intermediate layer 645 of alternating dielectric-cathode-dielectric-gate regions is affixed to the combined (P) region 641 and (N+) regions 643. A dielectric layer 647 is placed over top of the intermediate layer 645 and a cathode metal stripe 627 and a gate metal stripe 629 are optionally provided. The dielectric layer 647 has windows 649 through which the cathodes 627 and gates 629 contact the cathode and gate metal stripes of the intermediate layer 645 located beneath the upper dielectric 647. The cathode 627 connects with the (N+) regions 643 via the cathode metal of the intermediate layer 645. The gate stripe 629 connects with the (P) region 641 via the gate metal of the intermediate layer 645. The cathode metal 627 and the gate metal 629 improve connectivity.

Cathode 627 and gate 629 both extend the entire width of the GTO 603. They are cut short in the embodiment of FIG. 2 in order to illustrate the openings 649 in the dielectric. Another cathode is located on the cut-away portion of the dielectric. The GTO preferably has six cathode stripes 627, and seven gate stripes 629, in the current-carrying area of the device. Of course, any suitable number of cathode stripes 627 and/or gate stripes 629 can be provided within the scope of the invention. The current-carrying area is surrounded by a non-metallized high-voltage termination area.

A first layer of dielectric of the intermediate layer 645, labeled as dielectric 1 in FIG. 2, has a layer of dielectric deposited over the entire area of the wafer. The first layer of dielectric has openings etched into it, into which a first layer of metal has been deposited. This first layer of metal is masked and etched into the separate areas that form the gate and cathode, labeled as gate metal 1 and cathode metal 1. The gate-cathode junctions are located between the (P) base region and the (N) emitter regions, and labeled gate-cathode junction. A second layer of dielectric is provided, labeled dielectric 2. The layers form an upper junction (the gate-cathode junction), a lower junction (the (P) emitter junction), and an upper-lower junction (the anode-cathode junction).

The first layer of dielectric isolates the metal 1 gate areas from the metal 1 cathode areas. The first layer of dielectric also protects the gate cathode junctions from being damaged during the process of depositing the first metal layer and during the etching of this metal to define the discrete gate and cathode metal stripes, which run the length of the current-carrying area. The second layer of dielectric 647 isolates the metal 2 gate areas 629 from the metal 1 cathode areas, and the metal 2 cathode areas 627 from the metal 1 gate areas.

Figure 3:
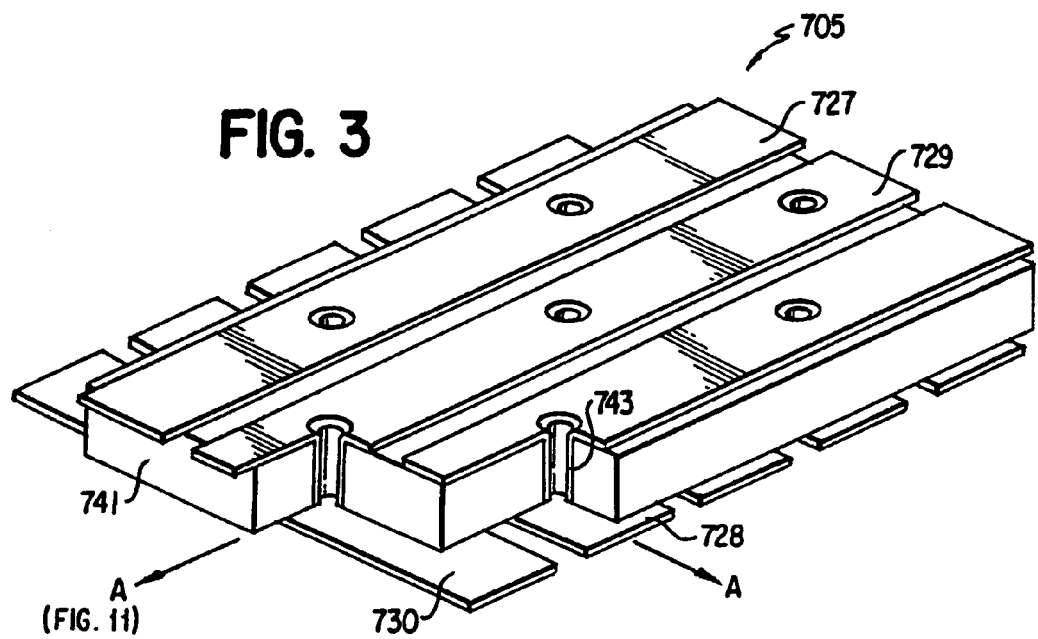
FIG. 3 is an isometric view of the lid, having a cutout portion.

A metallized ceramic lid 705 for use with the GTO die 603 is shown in FIG. 3. The lid 705 has a ceramic layer 741, with metals stripes 727, 729 and 728, 730 connected on opposite sides thereto. A metal stripe for the gate 729 and two metal stripes for the cathodes 727 are connected to the top of the lid 705. Metal stripes for the cathodes 728 and metal stripes for the gates 730 are connected to the bottom of the lid 705. Metallized feed-throughs or vias 743 extend through the ceramic layer 741 to connect the metal stripes 727, 729 on the top of the lid 705 with the respective metal stripes 728, 730 on the bottom of the lid 705.

The metal stripes 727, 729 on the top of the lid extend perpendicular with respect to the metal stripes 728, 730 on the bottom of the lid. The metal stripes 727, 729 provide a greater surface area to connect to external connectors, such as the FETs 209 or the second power electrode 213 shown in FIG. 6. The metal stripes 728, 730 on the bottom of the lid 705 are soldered to the metal cathode 627 and gate 629 of the GTO die 603, respectively.

Figure 4:
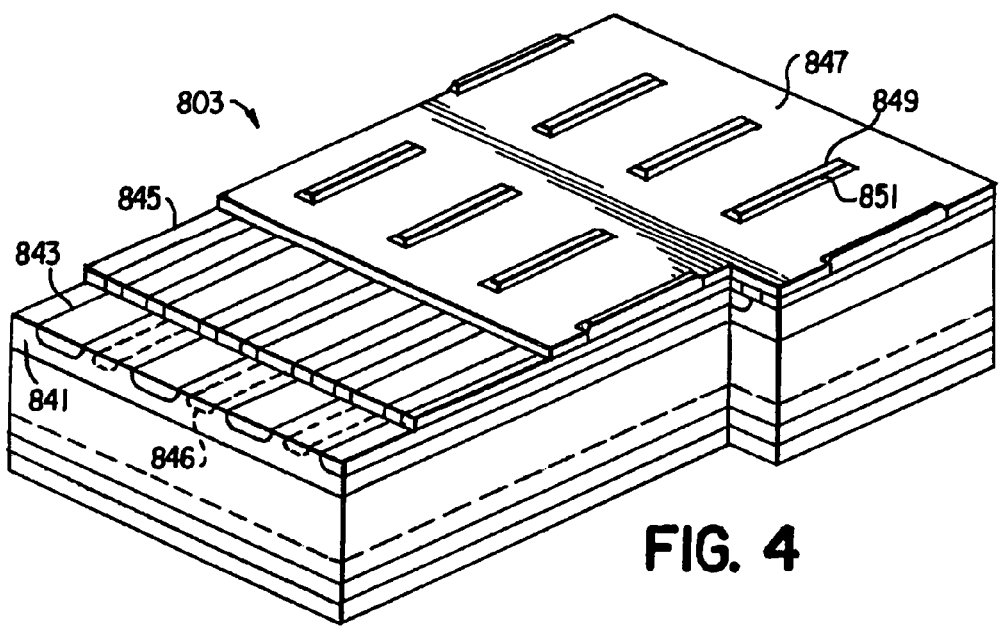
FIG. 4 is an isometric view of a GTO die in accordance with a second embodiment of the invention, having layers cut away for illustrative purposes.

Another embodiment of a GTO die 803 is shown in FIG. 4. Here, solder projections 851 extend outward from the top surface of the dielectric layer 847 and are positioned within openings 849 in the dielectric layer 847. The solder projections 851 are staggered to align with, and contact, the different areas of cathode metal and gate metal on the intermediate layer 845. The metal stripes 730, 728 of the lid 705 are soldered to the projections 849. There is preferably one lid-bottom metal stripe 728 for each row of solder stripes 849. In addition, an alternative (P+) region 846 is shown. The (P+) region 846 enhances the ohmic contact between the (P) region 841 and the (N+) region 843. The (P+) region 846 can be provided between each of the (N+) regions 843.

The number of parallel paths of cathode stripes and gate stripes provide a low inductance in the gate-FET-cathode loop, such that a negative voltage or a power supply is not needed to turn-off the GTO. A large inductance in the gate drive would cause problems in turning off the GTO since, as the current increases, the voltage across that inductance also increases, which in turn diminishes the supply voltage.

The voltage across an inductance increases as the rate-of-change of the current increases. Accordingly, when the inductance in the gate-FET-cathode loop is high (i.e., over about 0.6-0.8 voltage drop), the GTO cannot be turned off. Hence, a battery or power supply is connected in the gate-FET-cathode loop to apply a negative bias to the gate of the GTO, in order to compensate for the inductive voltage and achieve GTO turn-off.

Figure 5:
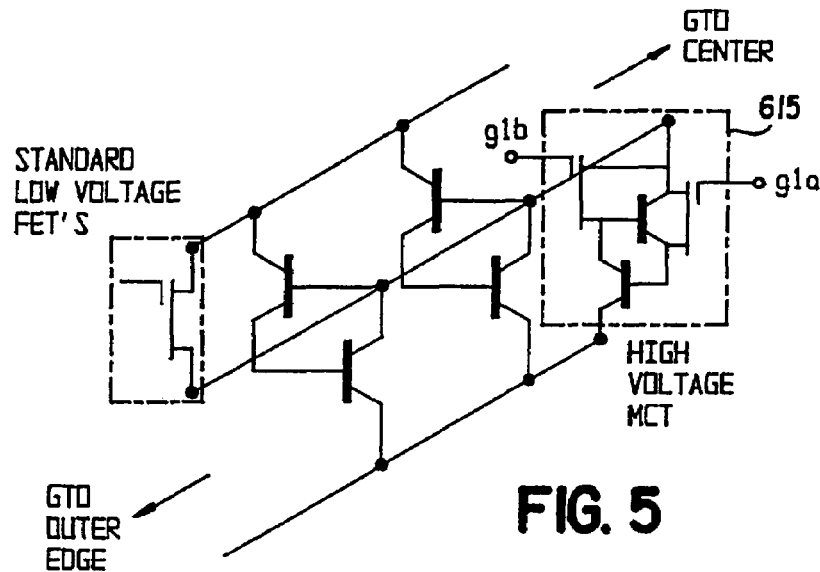
FIG. 5 is a circuit diagram showing the MCT connected to the GTO.

The connection of an MCT 615 to a GTO is shown in FIG. 5. One $cm^2$ of FET is needed for every 100 fingers for turn-off and one turn-on MCT is needed per GTO device. The MCT gate stage provides a low Vf path for inrush current and a low cost, yet very high current, gate for a reduction (about 10 times over current devices) in turn-on losses and an increase in rated di/dt capability. The resistor provides ballast and ultra-high current turn-off.

Figure 6:
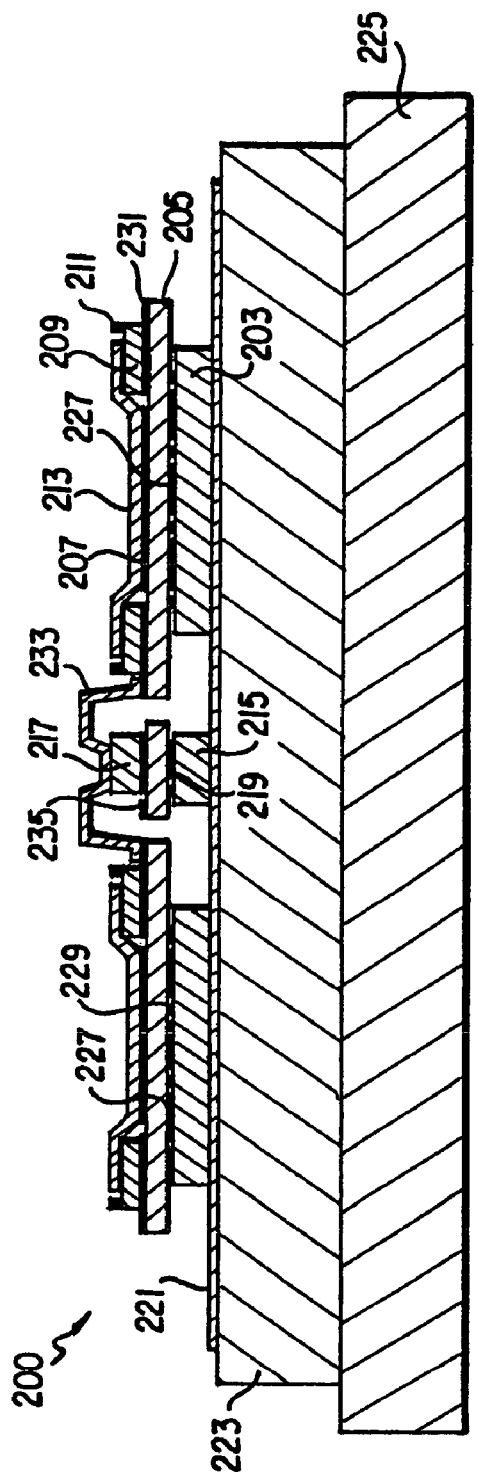
FIG. 6 is a cross-section of an MTO super-GTO with an MCT and two GTOs each having a separate lid.

FIGS. 6-9 show different implementations of Super-GTO power blocks 200, 300, 400, 500 of the present invention. FIG. 6 shows an MTO (MOS Turn-off Thyristor) 200 that forms an isolated base super-MTO in accordance with the present invention. The MTO 200 has two GTOs 203, four FETs 209 and an MCT (MOS Controlled Thyristor) 215. The power block 200 has a metal matrix 225 that dissipates heat, and an insulating substrate 223. A thin first power electrode 221 is affixed to the insulating substrate 223, opposite the metal matrix heat spreader 225. The two planar super-GTOs 203 are fixed to the power electrode 221. Each GTO 203 has a lid 205, which preferably is a lid packaged in accordance with the ThinPak technology.

The lids 205 have metal stripes 207, 231 on the top and metal stripes 227, 229 on the bottom. The metal stripes 207, 231 on the top of the lids 205 extend perpendicular to the metal stripes 227, 229 on the bottom of the lids 205. The top surface of the lids 205 has both central metal stripes 207 and side metal stripes 231. The metal stripes 227, 229 represent the gates 229 and cathodes 227 of the GTO 203. The top of the lids 205 connect to second power electrodes 213 and to FETs 209, via metal stripes 207, 231, respectively. Thus, the cathode 227 of the GTO 203 connects to the power electrode 213 through metal stripe 207, and the gate 229 of the GTO 203 connects to the FETs 209 through metal stripes 231.

A high voltage MCT 215 is located at the center of the power electrode 221, between the GTOs 203. A lid 219, preferably a ThinPak lid, connects to the MCT 215 via the cathode and gate metal stripes 235. A diode or resistor 217 is connected to the lid 219. A third power electrode 233 connects the diode or resistor 217 to the lids 205 of the GTOs 203 via metal stripes 231. However, any suitable components can be mounted on the top of lids 205, such as diodes, resistors, or MOSFETs, and the metal stripes 207, 231, 227, 229 can be configured to match those components. The lids 205, 219 have through-connects or vias that connect the respective metal stripes on opposing sides of the lids 205, 219, as more fully shown in FIG. 3.

The power block 200 turns on by having current flow from the first power electrode 221 to the third power electrode 233, through the MCT 215. The MCT 215 is high voltage to support the same high voltage as the GTO 203, and provides a high gate current for rapid turn-on of the GTO 203. The GTO 203 controls the flow of current between the first power electrode 221 and the second power electrode 213. The FET 209 has a low resistance-on and is used to turn-off the GTO 203.

Fast turn-on, or high di/dt (i.e., the rate of change of current with respect to time) capability, is achieved by having the voltage across the MCT 215 collapse very rapidly, thereby allowing the current to rise very rapidly. The present invention provides a high performance turn-on by the MCT 215 switching rapidly from blocking to conducting without being damaged. That is, the current can rise with a very high di/dt, and can survive this high di/dt without the MCT 215 being damaged by localized excessively high current densities.

The MCT 215 is a fast-turn-on device because it has a set of distributed internal MOSFETs for turn-on, in addition to a set of distributed internal MOSFETs for turn-off. Since these turn-on MOSFETs are insulated gate devices, they require much less current for turn-on than does a GTO, which has only a bipolar gate. The MCT 215 has many internal MOSFETs distributed uniformly over the entire device area, so that the entire MCT 215 area can be switched from the blocking state to the conducting state much more rapidly than the GTO.

This capability of the MCT 215 is utilized to make a power block with fast turn-on capability by placing a small MCT in parallel with one or more large GTOs 203. The MCT anode is connected to the GTO anode, and the MCT cathode is connected to the GTO gate. During turn-on, the small MCT 215 allows the current to rise more rapidly than is possible for the GTOs. Since the MCT is connected to the gate of the GTO, all the current through the MCT is also flowing through the GTO gate, providing a high gate current to turn the GTO on rapidly.

Because of the small area of the MCT 215, the high current density causes a rapid rise in device temperature, so that the MCT can carry this high current for only a limited period of time. However, the GTOs 203 turn on, and the high current, transfers to the GTOs 203, before the MCT temperature reaches a destructive level. A small MCT can be used as the MOS gated turn-on amplifying gate, and can remain gated on and will re-gate the GTO as necessary if, for instance, the current in the main circuit oscillates through zero. The MCT 215 is connected between the anode 221 and the gate 229, though an IGBT can instead be used.

The FET 209 has a gate 211 that receives the signal to turn-off the GTO 203, so that when the FET 209 is turned on, the GTO 203 turns off. The FET 209 turns on when a positive bias is applied to the FET gate 211. The metal stripe 231 connects to the GTO gate 229 through the lids 205. The metal stripe 231 connects to the GTO gate 229 through the lids 205. When the GTO 203 is turned on, the first power electrode 221 is at the same potential as the second power electrode 213, and current flows from the first power electrode 221 to the second power electrode 213.

When a positive bias is applied to the FET gate 211, the FET 209 is shorted (i.e., turned on) and the GTO 203 is turned off. When the GTO 203 is turned off, a high voltage exists and current cannot flow from the first power electrode 221 to the second power electrode 213. The third power electrode 233 is a floating electrode, i.e., it is not connected to the external circuit, and carries current only when the GTO is being turned on. The third power electrode 233 is turned on by applying a turn-on signal of about 10 volts to the MCT gate metal 235. That signal turns on the MCT 215, which allows current to flow from the first power electrode 221, through the MCT 215, to the third power electrode 233. The current continues to the metal stripe 231, through the lid 205, to the GTO gate 229. The current then flows from the GTO gate 229 to the GTO 203 and the GTO cathode 227, through the lid 205 to the second power electrode 213.

The GTOs 203 are approximately 30 mils thick and one square inch in area, the FETs 209 and the MCT 215 are each about 250 mils square in area. A 1200A (RMS), 6000 Å, current-off module, can contain between four and six 1-inch super GTOs 203 having a total of about 38 cm$^2$; about four 200 mil 30 volt FETs 209 per GTO 203 having about 6 cm$^2$; and about 1 cm$^2$ for the turn-on MCT 215.

Antiparallel diodes, also called freewheeling diodes, can be added that permit current to flow from the second power electrode 213 to the first power electrode 221, which is in the reverse direction of the GTO current. The diodes are placed beside the GTO, with the diode cathode soldered to the metal 221, which is the anode of the GTO, and the diode anode soldered to a metal area connected to 227, which is the cathode of the GTO. The antiparallel diodes further enhance the power block function at a minimal increase in cost. Antiparallel diodes are sometimes required in circuits. Since these diodes can be mounted in the power block, the user need not mount the diodes, thereby reducing the number of separate components the user must install.

In an alternative embodiment of the invention, the MCT 215 and diode 217 can be switched, so that the MCT 215 is on the top of the lid 219, and the diode 217 is on the bottom of the lid 219. A further lid can then be placed on top of the MCT 215.

Figure 7:
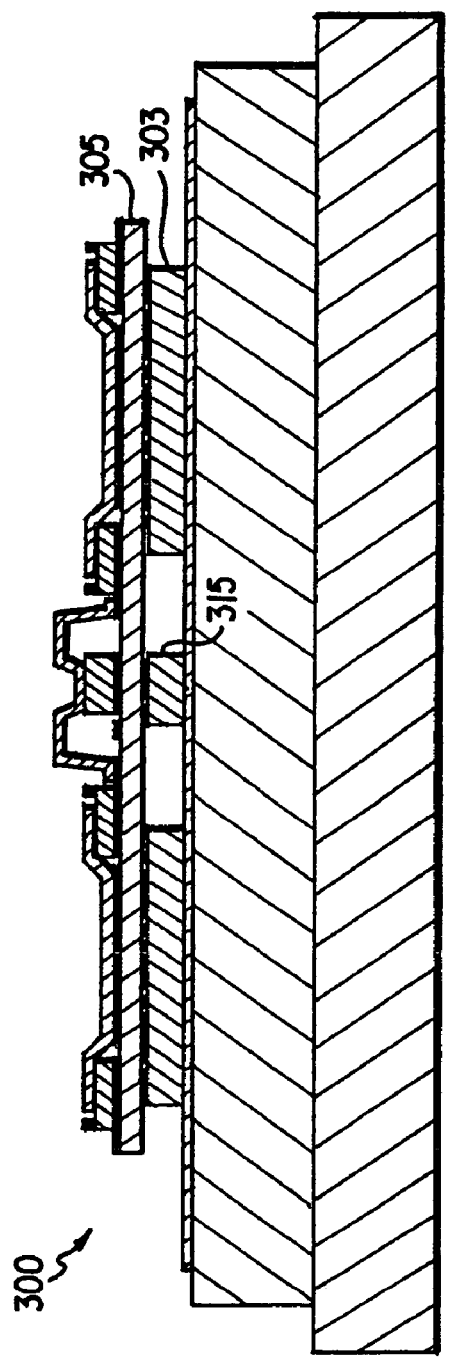
FIG. 7 is a cross-section of an MTO super-GTO with an MCT and a single continuous lid extending between the two GTOs.

FIG. 7 shows another embodiment of the invention. The power block 300 is similar to the power block 200 of FIG. 6, except that the lid 305 continually extends between the two GTOs 303 and MCT 315. In effect, the lid 219 of the MCT 215 is integrated with the lids 205 of the GTOs 303. The power block 300 operates in a manner similar to the operation of power block 200. The power blocks 200, 300 are particularly useful for GTOs 303 having fine geometries since the metal pattern of the lid 205 is capable of contacting finer geometries than is the pole-piece of a PressPak.

Figure 8:
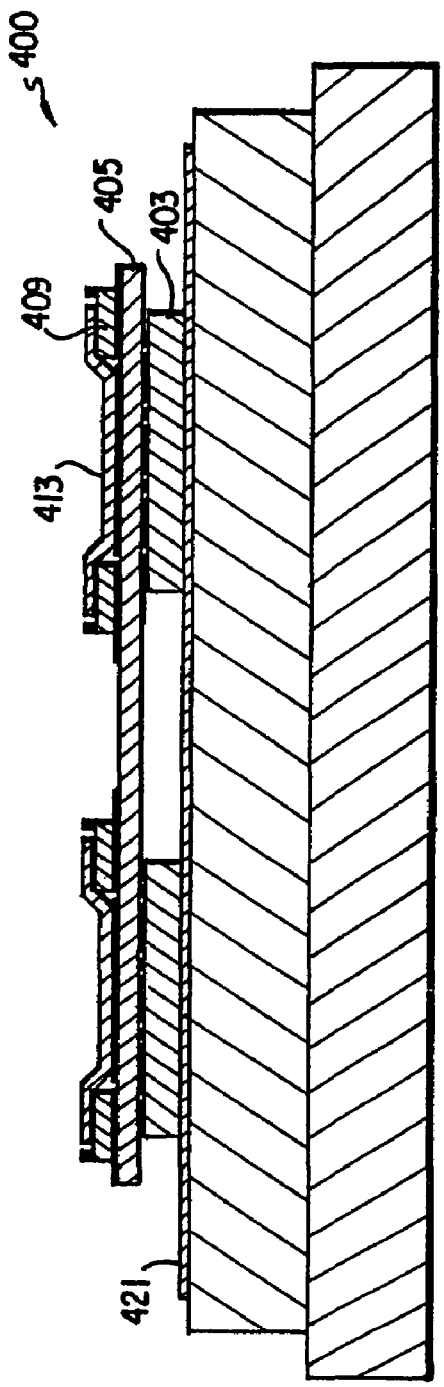
FIG. 8 is a cross-section of a super-GTO having a single continuous lid extending between two GTOs.
Figure 9:
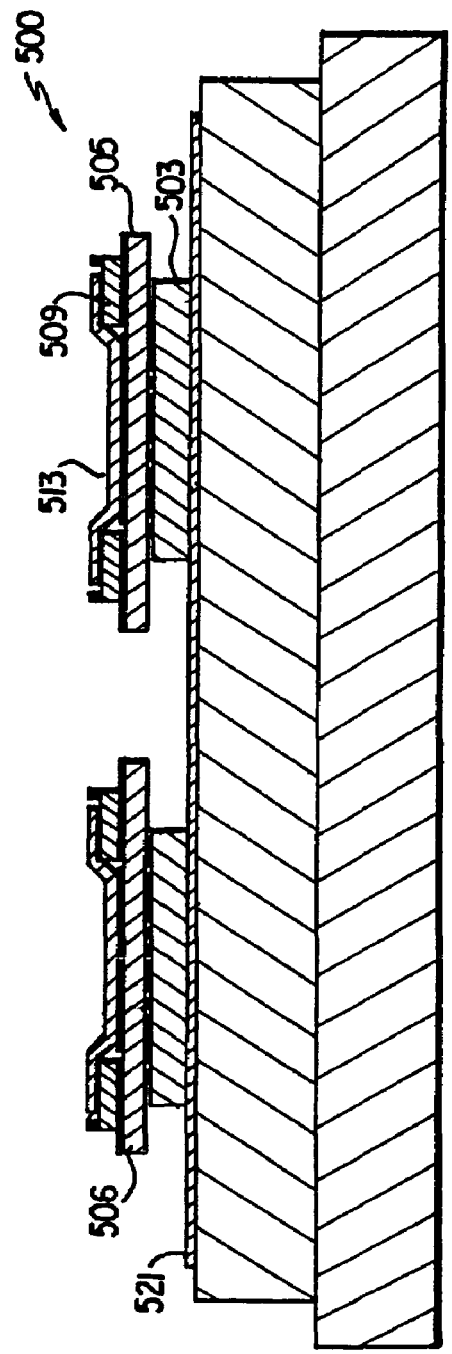
FIG. 9 is a cross-section of a super-GTO having two GTOs each with a separate lid.

Still, other alternative embodiments of the invention are shown by the power blocks 400, 500 of FIGS. 8 and 9, respectively. The power block 400 has a single continuous lid 405 that extends between the two GTOs 403. The power block 500 has two lids 505, one for each GTO 503. However, unlike the power block 200 of FIG. 6, the power blocks 400, 500 do not include an MCT, diode or resistor, or third power electrode. Here, the GTOs 403, 503 control the flow of current between the first power electrode 421, 521 and the second power electrode 413, 513.

Since an MCT is not provided, turn-on of the GTO, by a signal applied to the GTO gates 229, is not as rapid as for the power blocks 200, 300. The MCT permits current to rise at a rate at least 10 times more rapidly than the GTO alone. An MCT, however, results in higher costs for the added element, as well as for packaging, and therefore are only needed where turn-on time is critical. In addition, there is a cost of the gate circuit since the MCT 217, 317 provides the pulse of the gate current required to turn on the GTO. A gate circuit for a voltage-driven device, such as the MCT, is usually cheaper than the gate circuit for a current-driven device, such as the GTO. Accordingly, the cost of the MCT and gate circuit may be less than the cost of the GTO current-driven gate circuit, so that an MCT might be practical even for those applications in which fast turn-on is not critical.

The power blocks of FIGS. 6-9 provide low parasitic inductance and resistance, which are key to performance of the power blocks shown in FIGS. 10(a)-(g). In addition, the power blocks distribute a high gate current throughout the GTOs 203, 303, 403, 503 since the lids 205, 305, 405, 505 provide the conductivity equivalent to two layers of highly conductive metal. The lids 205, 305, 405, 505 enable both a high current gate and a high current cathode contact to the planar GTOs 203, 303, 403, 503 (where gates are not formed by deep silicon etching), which is compatible with modern MOS processes.

FIGS. 10(a)-(f) represent the various MTO circuits 100 in accordance with the present invention. The circuits 100 are constructed by power blocks of fine-geometry GTOs that are coupled to other elements of the circuit by dielectric lids having metal patterns on both sides connected by metallized vias through the lids. The circuits 100 each have a GTO thyristor 103 and various super GTO blocks. The circuits 100 use MOS elements for turn-off capability, and 5 of the 7 circuits use a high voltage MCT for MOS gated turn-on. Of course, the thyristor can be combined with MOS gated devices, such as an IGCT or an MTO. A thyristor-IGCT combination is formed by having an MTO with extra gate voltage that assists turn-off. The power blocks 100 enable very low resistance FETs 109, which are inexpensive, to be used and multiple die to be combined in low-cost modules.

Figure 10A:
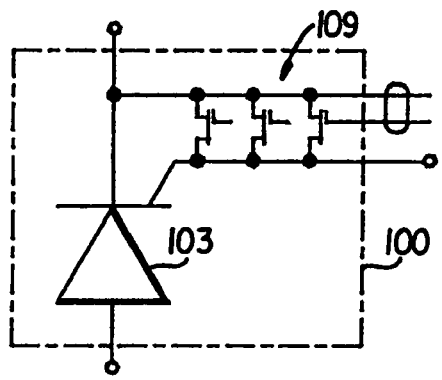
FIGS. 10(a)-(g) are circuit diagrams of the various embodiments of the super-GTO.

FIG. 10(a) is a standard MTO configuration, with FETs 109 connected to GTO thyristor 103. The circuit diagram of FIG. 10(a) is shown implemented in FIGS. 8 and 9. The MTO is essentially a discrete version of an MCT, as far as the turn-off function is concerned. The MTO has a large discrete GTO 103 with a number of discrete MOSFETs 109 connected between gate and cathode of the GTO 103, such that the GTO 103 turns off when the MOSFETs 109 are turned on. Turn-off of the GTO 103 occurs because the MOSFETs 109 provide a low resistance shunt path which allows current from the (P) base region inside the GTO 103 to reach the cathode electrode without crossing the (N) emitter junction inside the GTO 103, thereby causing the injection of electrons from the (N) emitter to cease, resulting in turnoff.

Figure 10B:
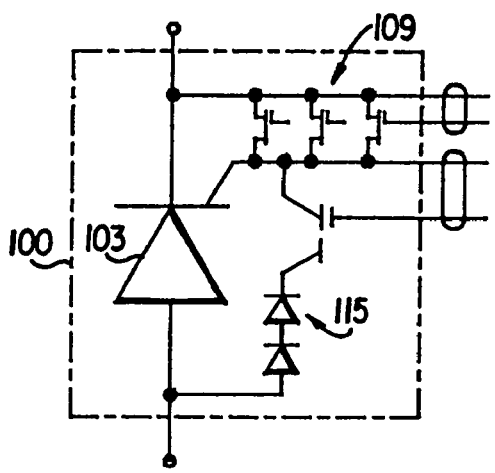

An MCT contains exactly the same components in a monolithic structure as an MTO, and functions in exactly the same way, during turn-off. The MTO and MCT differ in the turn-on mechanism because the GTO in an MTO is turned on by a bipolar gate electrode directly connected to the P base region, while the GTO in an MCT, such as shown in FIG. 10(b), is turned on by monolithically integrated insulated gate transistors, i.e. MOSFETs, internally connected between the cathode electrode and the N base region.

The MCT is the preferred device, but is more expensive because of the greater number of processing operations, and the low yield of large-area devices, resulting from the requisite large-area insulated gate structure. A GTO die of the same area is less expensive because it has fewer processing operations, and no insulated gate, since it is made into an MTO by assembling it with a large number of small-area, low-voltage, low cost insulated gate devices.

The MTO inherently has a higher inductance, as compared to the MCT, in the loop connecting the discrete MOSFET to the GTO gate and cathode, and this inductance degrades the turnoff capability. In the MCT, the MOSFETs are monolithically integrated into the GTO chip, so this inductance is essentially eliminated. The advantage of using a fine-geometry GTO (a super GTO) with a dielectric lid having appropriately metallized areas on top and bottom, connected by metallized vias through the lid, is that the loop areas of the individual MOSFET-gate-cathode circuits are reduced, resulting in a lower gate inductance than is possible in structures with larger geometries and printed-circuit-board connections.

The metal pattern on the lower side of the lid is designed to match the gate-cathode geometry of the GTO chip, and the metal pattern on the top side of the lid is designed so that the discrete MOSFETs can be mounted on the lid, connecting to gate and cathode areas by means of metallized vias through the lid, to provide a low-inductance, low-resistance path between gate and cathode.

FIG. 10(b) is an MTO block with high performance turn-on and is implemented, for instance, by the embodiments of FIGS. 6 and 7. FIG. 10(b) is the same circuit as FIG. 10(a), but with an MCT 115 that is provided for a high performance, i.e., fast turn-on, of the GTO thyristor 103. FIG. 10(b) is an advanced MTO that incorporate MOS turn-on by using the small trigger MCT 115, so that the GTO yield (i.e., the manufacture of good devices) and the FET yield are independent of one another.

Figure 10C:
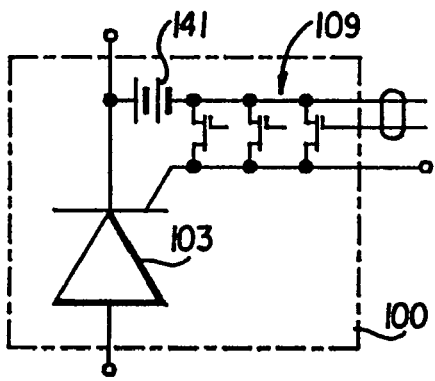

FIG. 10(c) is a standard IGCT, and is implemented, for instance, in the embodiments of FIGS. 8 and 9 by placing the battery 141 between the second power electrode 413, 513 and the FETs 409, 509. The battery 141 can simply be secured to the lid 405, 505 at the proper position for connection to the second power electrode 413, 513 and the FETs 409, 509. The battery 141 provides better turn-off of the GTO when the internal voltage of the GTO is not sufficient by itself, as noted above.

Figure 10D:
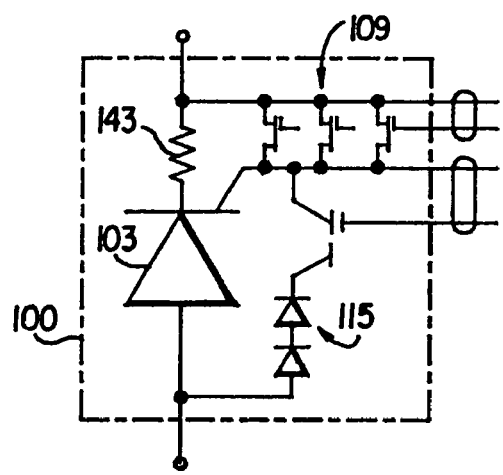

FIG. 10(d) is an advanced MTO block with an MCT 115 for high performance turn-on, and a resistor 143 for ultra-high current turn-off. The resistor 143 is connected in series with the GTO thyristor 103, and in parallel with the FETs 109. The resistor 143 increases the maximum current which can be turned off because the voltage drop across 143 functions in the same way as the voltage of battery 141 of 10 (c), in that it diverts more of the GTO current out through the gate electrode, rather than out through the cathode electrode, during turn-off. Resistor 143 has the undesirable effect of increasing the forward drop across GTO 103 in its conducting state, but the overall improvement in turn-off capability make it worthwhile to accept this higher forward drop. In addition, resistor 143 can serve as a ballast resistor to assure uniform current sharing among devices when the block contains a number of GTOs connected in parallel.

Resistor 143 can also be used for current-sensing purposes, to detect the amount of current flowing through the device, and to take measures to assure safe operation. For instance, if the current is rising, the information from the current sensor and logic circuit might signal the device to turn off before the current reaches an unsafe level. Or, if the current has already climbed to a value higher than the safe turn-off level, the logic circuit can prevent the application of a gate turn-off bias, and can signal for other circuit elements to interrupt the current. FIG. 10(d) is implemented in the embodiments shown in FIG. 6 or 7, by connecting resistor 143 between metal 207 and second power electrode 213 on top of lid 205.

Figure 10E:
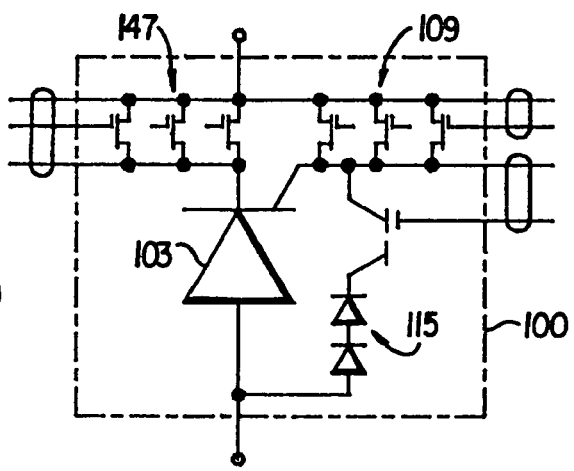

FIG. 10(e) is an Emitter Switched Thyristor (EST) block GTO having the MCT 115 for high performance turn-on, in which resistor 143 of FIG. 10(d) has been replaced by a bank of low-voltage MOSFETs 147. These can have a lower resistance than the resistor 143, for a lower forward drop when the GTO is conducting, and a higher resistance than the resistor 143, for a higher turn-off capability when the GTO is being turned off. In addition, they can provide current sense and current-limiting capabilities For the emitter switched thyristor, all current flows through the bank of low-voltage MOSFETs 147 that are in series with the thyristor. The MOSFETs 147 saturate in current, thereby limiting the peak current, which can flow, and assuring that the current will not rise to a level too high for safe turn-off.

Once the MOSFETs 147 turn off, they stop all current from crossing the gate-cathode junction, thereby completely stopping the injection of electrons inside the GTO. The voltage across the turned-off MOSFETs produces a negative bias on the GTO gate, just as does the addition of a battery to the circuit of FIGS. 10(c) and 10(f).

Figure 10F:
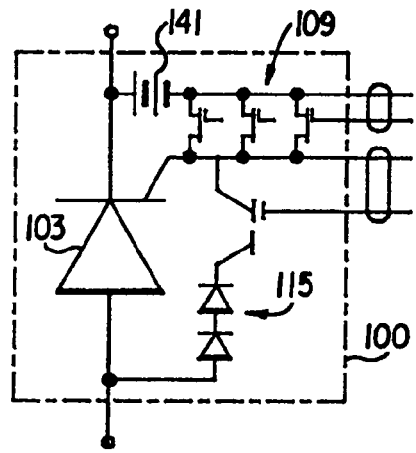

FIG. 10(f) is an IGCT block that has the MCT 115 for high performance turn-on, and a battery 141 for high performance turn-off, thereby combining the features of FIGS. 10(b) and 10(c). FIG. 10(f) is implemented, for instance, by connecting the battery 141 between the second power electrode 213, 313 and the FETs 209, 309, in the embodiments of FIG. 6 or 7.

Figure 10G:
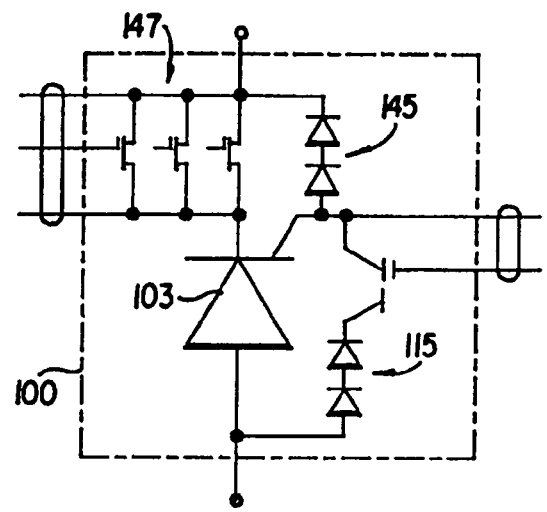

FIG. 10(g) is an EST block (GTO) but with MOSFETS 109 replaced by a series of diodes 145 to provide the path for reverse gate current flow during turn-off, and to provide current sense.

The present invention provides high voltage, high current MOS control with discrete FETs to achieve higher yields. However, more silicon is required and there is a more complex packaging of elements. The MTO embodiments of FIGS. 10(a), (b) and (d) are the simplest, but require the lowest inductance package. The EST embodiments of FIGS. 10(e) and (g) require an additional FET switch or diode switch and the IGCT of FIGS. 10(c) and (f) require an additional power supply.

Figure 11:
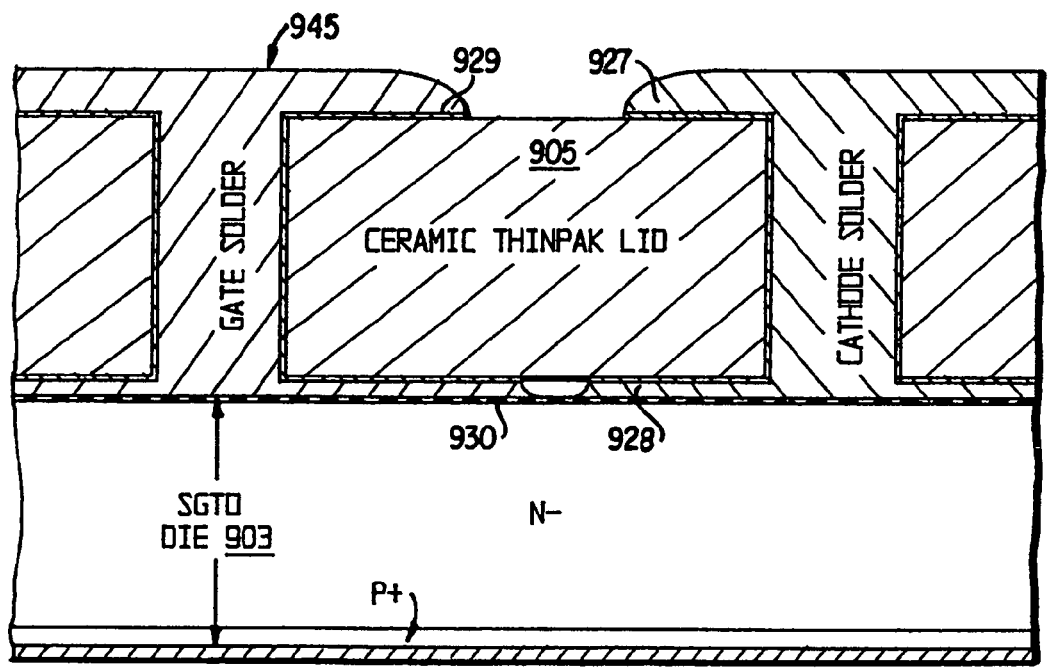
FIG. 11 is a cross-sectibn through the super-GTO die and lid, taken along lines A-A of FIG. 3.

Turning next to FIG. 11, a section of the power block is shown, taken through the GTO die 903 and lid 905, taken along the cutout portion designated by lines A-A of FIG. 3, and looking from the right of that embodiment toward the left. Solder extends from the top of the lid, through vias 943, to connect the gate 929 on the top of the lid 905 with the gate 930 on the bottom of the lid 905, as well as to connect the cathode 927 on the top of the lid 905 with the cathode 928 on the bottom of the lid 905. Though the vias 943 are shown having sharp corners, they can also be tapered, as reflected in the embodiment of FIG. 3. The solder 849 of FIG. 4 merges with the solder of the lid during assembly.

Figure 12:
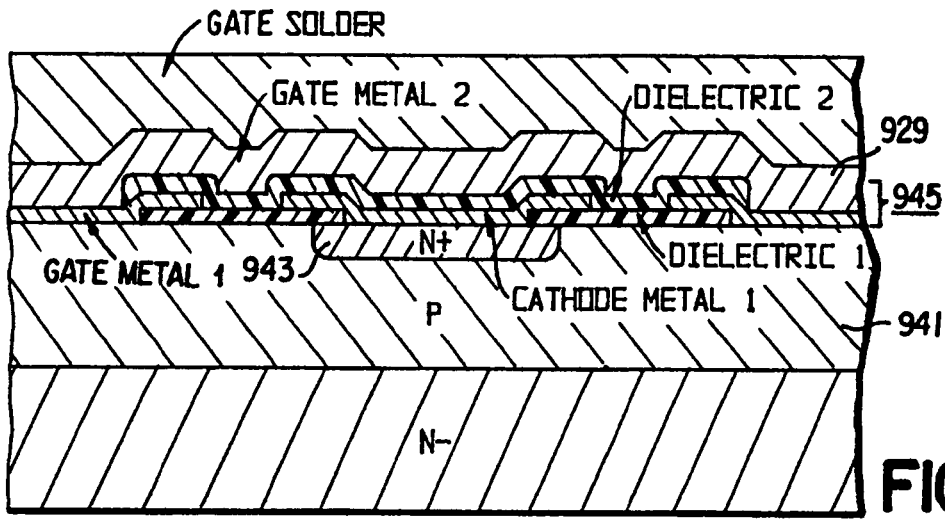
FIG. 12 is a cross-section of the GTO die of FIG. 2 at its gate contact area.
Figure 13:
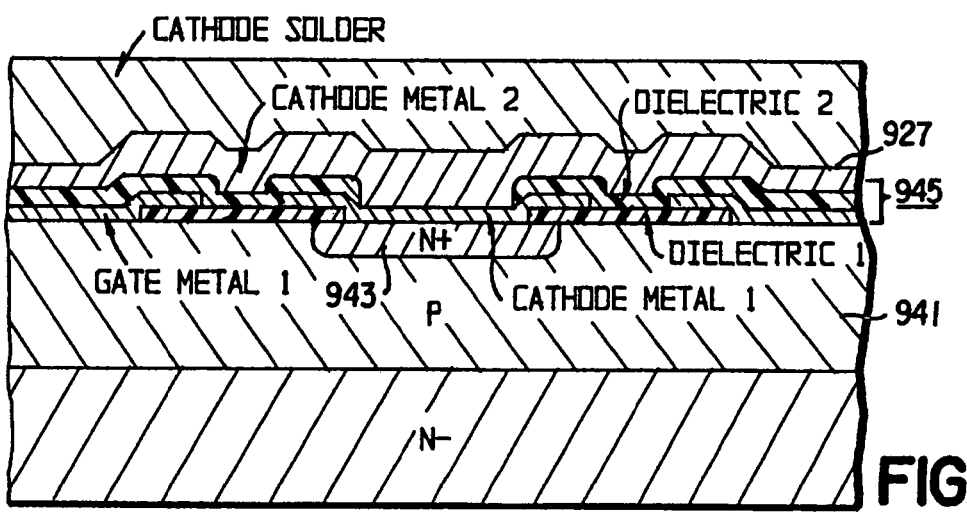
FIG. 13 is a cross-section of the GTO die of FIG. 2 at its cathode contact area.

FIG. 12 is a cross-section of the GTO die of FIG. 2 at its gate contact area 929, and FIG. 13 is a cross-section of the GTO die of FIG. 2 at the cathode contact area 927. The gate 929 and cathode 927 each contact the intermediate layer 945, which is positioned on the (N+) and (P) regions 943, 941. For the gate 929, the dielectric layer of the intermediate layer 945 covers the cathode metal of the intermediate layer 945, so that the gate metal 929 only contacts the gate metal of the intermediate layer 945. For the cathode 927, the dielectric layer of the intermediate layer 945 covers the gate metal of the intermediate layer 945, so that the cathode metal 927 only contacts the cathode metal of the intermediate layer 945. The cathode metal of the intermediate layer 945 contacts the (N+) region 943, and the gate metal of the intermediate layer 945 contacts the (P) region 941.

The combined effect of FIGS. 11-13 is that the gate solder extending through the via 943 connects the gate 929 on the top of the lid 905 to the (P) region 943 of the GTO die 903. Likewise, the cathode solder extends through the vias 943 to connect the cathode 927 on the top of the lid 905 to the (N+) region 941 of the GTO die 903.

Figure 14:
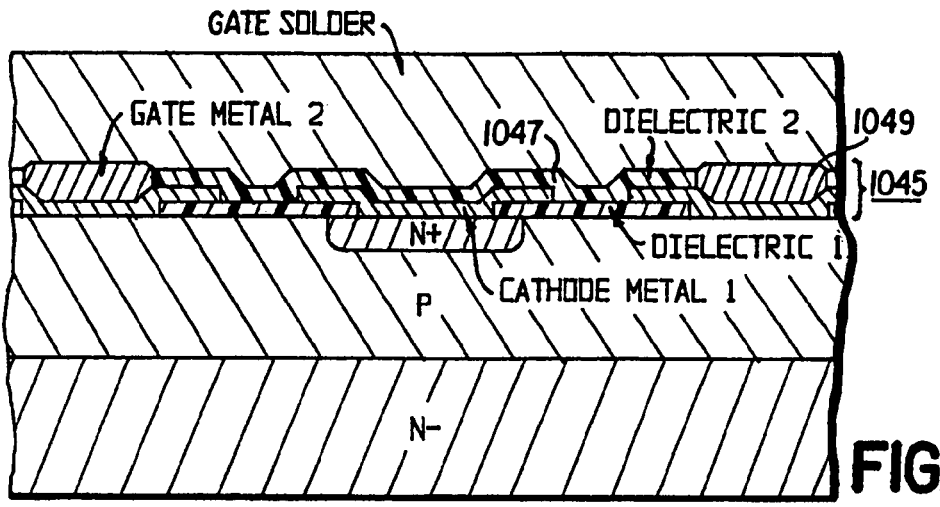
FIG. 14 is a cross-section through the gate contact area for the embodiment of FIG. 4.
Figure 15:
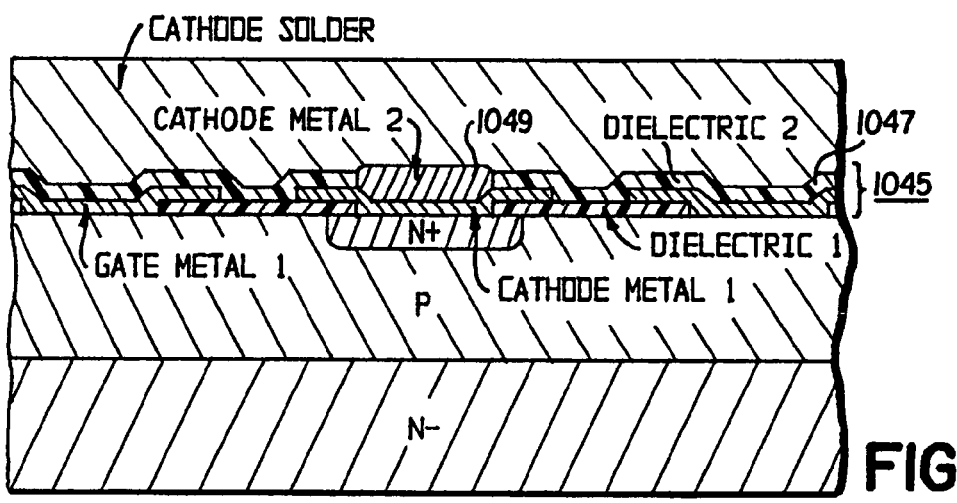
FIG. 15 is a cross-section through the cathode contact area for the embodiment of FIG. 4; and, FIG. 16 is an isometric cut-away view of another embodiment of the GTO die, having layers cut away for illustrative purposes.

FIG. 14 is a cross-section through the gate contact area for the embodiment of FIG. 4 and FIG. 15 is a cross-section through the cathode contact area for the embodiment of FIG. 4. FIGS. 14 and 15 are similar to FIGS. 12 and 13, respectively, except that the gate metal of the intermediate layer 1045 is only located in the openings 1049 of the dielectric layer 1047, and not along the entire upper surface of the dielectric layer 1047.

The invention provides approximately three times the performance of the traditional GTO with the added value of MOS controlled turn-on and turn-off, and is inexpensive. Those features are a result of the power FETs 109 having a low on-resistance, the MCT 115 can be used for low gate drive cost and high di/dt turn-on, and the lid 205, 305, 405 allows the GTO to be manufactured with planar technology and to be packaged with ultra-low inductance and low resistance to both gate and cathode.

In accordance with the preferred embodiment, the super-GTO is incorporated in various power block configurations with single side cooled modules, as shown. However, the super-GTO can be cooled on two sides in a pressure package by building up the anode and cathode electrode for the block with metal posts, encapsulating the super-GTO with an expansion-matching plastic, and machining and/or polishing to expose the appropriate power electrodes. This alternative can be with or without electrical isolation to the heat sink.

The lid is a 2-sided patterned ceramic member with arbitrary conducting via locations. The bottom side of the lid is patterned to contact a multi-electrode GTO, while the top side is patterned to bond a surface mount FET or a flip-chip FET die to facilitate the GTO-FET interconnection. The connection might be from a gate-to-cathode (MTO) or in series with the gate and/or cathode EST or any other suitable alternative. The lid is also suitable for mounting ballast resistors, which can be connected in series with multiple GTOs operated in parallel. The ballast resistors assure equal current-sharing among the various die.

Finger width is on the order of 1 mil (about 24 microns), with a peak turn-off of at least 100 A/cm$^2$. The peak turn-off is roughly given by the emitter base avalanche breakdown voltage divided by the resistance of the base from the center of the emitter to the edge of the emitter. The GTO device uses ion implanted and diffused junctions that are shallow, which reduces the thickness of the GTO device. As a result, the forward drop is reduced by about 25% and the switching losses are reduced about 35%. Modern power device fabs provide sophisticated finger design having more uniform device turn-off and correspondingly higher SOA (Safe Operating Area), which allows substantially snubber-free operation.

High voltage MCTs and diodes are used with greater than 90% of the theoretical breakdown voltage in a 4,000 volt starting material and low (less than 2 volt) forward drop. The breakdown voltage is achieved by an edge termination process using ion implantation and small mask features that is known as junction termination extension (JTE), as described in U.S. Pat. No. 4,927,772, which is incorporated by reference herein. To achieve 0.9 of the ideal breakdown voltage, a 4 kV GTO without JTE termination needs about a 2 degree negative bevel with less than 30 mils.

One of the key advantages of JTE is that the depth of the upper p-base junction is decreased. For a depth on the order of 10 microns, about an order to magnitude thinner than in standard GTOs. With the cathode finger width being so narrow, the upper base sheet resistance could be increased and the device could turn-off very high current densities. The net result is that the upper transistor gain in the GTO is very high. This allows the gain of the lower transistor to be much smaller than usual.

Typically, power losses in switching devices are primarily due to the forward drop in steady-state conduction and the switching losses as the device turns off. Switching losses are usually reduced by adding heavy-metal dopants or crystal damage to produce recombination centers that cause holes and electrons to recombine more rapidly, or by reducing efficiency of the (P) emitter, which reduces the number of holes injected in response to each electron collected. Switching losses are reduced to provide a faster turn-off by reducing the level of conductivity modulation.

However, as switching losses are reduced, conductivity modulation also inherently increases the resistance and produces an undesired effect of a higher forward drop and hence an increase in conduction losses. Accordingly, there is a tradeoff between switching dissipation and forward dissipation. Finer geometries achieved by the present invention improve that tradeoff by reducing the lateral distance across which carriers must travel to be removed. The net result is an improved tradeoff between forward drop and turn-off energy, and turn-off energy is greatly reduced and forward drop decreased. Part of the advantage comes from the density of the fingers that results in a uniform current density through all but the upper 10 or 20 microns of the GTO. Forward drops of less than 2 volts are easily achievable at current densities of 100 A/cm$^2$, a current density that is very much higher than the rated RMS current densities of standard GTOs.

The proper die size should be chosen to avoid a die that is either too large or too small. A die that is too large results in excessive packaging problems due to the small but finite difference in expansion coefficient between the silicon die and the aluminum nitride voltage isolation base. In addition, a large die can result in breakdown voltage loss of about BV yield$\approx$0.95$^n$, where n=sqrt(Area) with area in cm$^2$. On the other hand, if the die is too small, there is too much wasted breakdown voltage termination area.

For illustrative purposes only, consider a 1200 A plus GTO of 40 cm$^2$ total area from four 10 cm$^2$ active area die. For 90% breakdown voltage, the termination would be, for instance, 30 mils, plus another 20 mils as insurance. Each die should be less than 3.4 cm$^2$ on a side for a net area of 11.5 cm$^2$ and an "n" value of 3.4 and a yield of 0.84. The total started silicon for the 1200 A device would be 4*11.5/0.84=54.8 cm$^2$. In comparison, a 85 mm, 1200 A standard GTO built on a 95 mm starting wafer has 36.5 cm$^2$ that ends up as a finished device active area. The termination area might exceed 20% of the net area. Thus, at 50% yield, 2 wafers must be used, i.e., 113.5 cm$^2$, to achieve 36.5 cm$^2$ of useful standard GTO.

The GTO of the present invention is based on breakdown voltage yield, as opposed to MOS gate yield. The GTO does not need MOS gate yield since it is limited by termination area yield alone. To simultaneously yield gates in the GTO device, and assuming an 80% yield for a 1 cm$^2$ MOS gate area, then the yield of each 11.5 cm$^2$ GTO (10 cm$^2$ active area) elements would be about 11% for gates and about 9% overall.

Making a 40 cm$^2$ power device with four equal size MCTs or IGBTs rather than from integrated discretes would require 40*0.84/0.09=373 cm$^2$ of silicon that would also require an additional half a dozen mask steps. Thus, MOS-based power modules must be built from smaller die. For instance, using 40 MCTs (1 cm$^2$ active area, 1.7 cm$^2$ with a 5 kV breakdown voltage termination) device would require about 40*1.7/.0.8=85 cm$^2$ of initial silicon based on gate yield alone and 85/0.92=92.4 cm$^2$ when breakdown voltage yield is also taken into account.

The present invention results in a low-cost GTO device. The GTO requires a negligible mounting force, which saves on cost and size of mounting hardware. An isolated base is provided that is desirable from a system standpoint since the device is electrically isolated from the heat sink. An isolated base provides a total system cost that is less than if the isolation were installed outside the device packages. The GTO does not need to have a hermetic seal, but instead has a plastic encapsulation that is much less expensive and easier to build in a low impedance gate.

In addition, the GTO is much smaller, which results in a lower cost, yet provides the same functionality. The GTO of the present invention also has a significantly larger (on the order of ten times) current-off limit, a more uniform current, and a lower voltage on, which results in less heat to dissipate. In addition, the GTO eliminates at least one diode, which saves on the diode cost, packaging and parasitics. The MOS control is much smaller and more rugged with minimum parasitics, and MOS devices are more cost effective to control than current supplying devices needed to control bipolar transistors. The reduced parasitics also eliminate the need for parasitic suppression elements.

Figure 16:
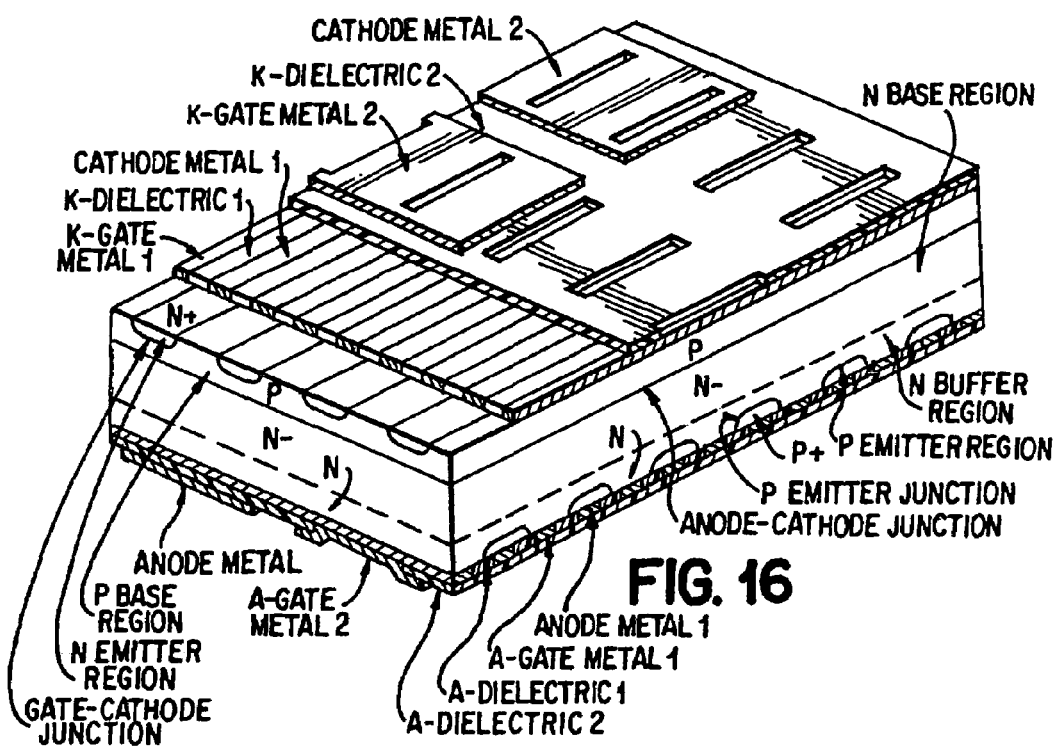

In accordance with an alternative embodiment, a Fast Turn-off (FTO) could be used without the need for wafer bonding at about a 60% yield for a 35 mm die. Referring to FIG. 16, the FTO is a thyristor with two bipolar gates, one attached to each of the two base regions. The dual-gate thyristor can turn off faster than a single-gate thyristor because the two gates simultaneously stop injection of carriers from both emitters.

In a single-gate thyristor, in contrast, injection is stopped from only one emitter, and injection from the other emitter continues until the concentration of excess carriers falls down close to the background level. The (N) emitter and (P) emitter stripes are shown perpendicular to each other, but they can also be parallel. The bottom metal is an array of alternating anode stripes and gate stripes, similar to the array of cathode stripes and gate stripes of the top metal.

The delay in the single-gate thryistor results in slower turn-off for the single-gated device, which limits the single-gated device to operating at a lower frequency than is possible for a dual-gated device. The dual-gate thyristor has fine geometries on both sides of the device, and lids on each side to make the appropriate connections. The FTO GTO/SCR block operates at about three times higher frequency than a single-gated device having similar voltage-blocking capability, and similar forward drop. The FTO with two internal bipolar gates and two external insulated gates provides a much simpler structure and substrate wafer baseline than a process for building the FTO with two internal insulated gates.

The foregoing descriptions and drawings should be considered illustrative only of the principles of the invention. Therefore, it is not desired to limit the invention to the specific examples disclosed. Rather, all suitable modifications and equivalents may be resorted to, falling within the scope of the invention.

We claim:

1. A gate turn-off thyristor device comprising:
a lower portion having at least one lower base region of a first conductivity type and at least one lower emitter region of a second conductivity type;
an upper portion situated above said lower portion, said upper portion having a plurality of upper base regions of the second conductivity type and a plurality of upper emitter regions of the first conductivity type, wherein the plurality of upper base regions each forms one of a plurality of first conductive contacts and the plurality of upper emitter regions each forms one of a plurality of second conductive contact, the first conductive contacts alternating with the second conductive contacts and forming a top upper surface of the upper portion, wherein the top upper surface is a planar surface, wherein each of said plurality of first conductive contacts and each of said plurality of second conductive contacts are parallel to each other from a plan view;

an intermediate layer having first regions of a first metal alternating with second regions of a second metal and non-conductivity regions between the first regions and the second regions, the first regions of said intermediate layer directly connected to the first conductive contacts, and the second regions of said intermediate layer directly connected to the second conductive contacts;

a dielectric layer formed over said intermediate layer, the dielectric layer having openings; and, first and second metal stripes formed over said dielectric layer to traverse the first and second regions of said intermediate layer, said first metal stripes directly contacting the first regions of said intermediate layer through the openings in said dielectric layer and said second metal stripes directly contacting the second regions of said intermediate layer through the openings in said dielectric layer, wherein said lower portion and said upper portion form said gate turn-off thyristor device.

2. The device of claim 1, wherein the plurality of upper emitter regions each comprises at least one finger having a width of less than 100 microns.

3. The device of claim 1, wherein the upper surface of the plurality of upper base regions each comprises a finger having a width of less than 100 microns.

4. The device of claim 1, further comprising a lid having a layer of insulator with upper and lower surfaces, at least one upper metal stripe extending along the upper surface of the insulator, at least one lower metal stripe extending along the lower surface of the insulator, wherein a first one of the at least one lower metal stripe, and a second one of the at least one lower metal stripe is connected to at least two of the second conductive contacts, said lid further comprising conductive vias directly connecting the at least one upper metal stripe with the at least one lower metal stripe, wherein said first and second metal stripes further contact a respective one of the first and second ones of the at least one lower metal stripes of said lid.

5. The device of claim 4, wherein the said first and second ones of the lower metal stripes cross with said upper emitter regions.

6. The device of claim 4, wherein the upper and lower metal stripes are elongated, and the upper metal stripes cross with the lower metal stripes.

7. The device of claim 1, wherein the first and second conductive contacts have a combined total width of less than 0.5 cm.

8. The device of claim 4, wherein each lower metal stripe is connected to at least two of the first and second conductive contacts.

9. The device of claim 4, wherein at least one upper metal stripe connects to one or more electrodes on a control device mounted on said lid.

10. The device of claim 1, the lower portion comprising a substrate wafer, wherein the upper base region and upper emitter regions are diffused from an upper surface of the wafer to form planar junctions.

11. The device of claim 1, wherein said upper portion comprises a dense arrangement of upper emitter regions.

12. The device of claim 1, wherein the first and second conductive contacts alternate in a regular repeating form.

13. The device of claim 1, wherein said gate turn-off thyristor turns off a current density of at least 500 A/cm2.

14. The device of claim 1, wherein the plurality of upper emitter regions has a repeating pattern along a cell of good and moderate injection regions, and/or good and moderate contact impedance regions, and/or wider and narrower emitter regions.

15. The device of claim 4, wherein a control device is mounted on said lid, the control device controlling said gate turn-off thyristor device.

16. The device of claim 1, further comprising a controlled thyristor connected to the plurality of upper base regions and providing fast turn on of said gate turn-off thyristor device.

17. The device of claim 1, further comprising an integrated gate controlled transistor connected to the plurality of upper base regions.

18. The device of claim 1, wherein the differential induction between the upper base region and the upper emitter region is less than one percent of the total inductance of said gate turn-off thyristor device.

19. The device of claim 1, wherein the first conductive contacts and the second conductive contacts are coplanar and the plurality of upper base regions and plurality of upper emitter regions are arranged to form an even and continuous upper surface.

20. The device of claim 1, wherein the first conductive contacts and the second conductive contacts form a repeating pattern of at least one of the plurality of first conductive contacts alternating with at least one of the plurality of second conductive contacts.

21. The device of claim 1, wherein the upper portion further comprises at least one enhanced base region of a first conductivity type, the at least one enhanced base region positioned between the plurality of upper emitter regions and enhancing contact between the plurality of upper base regions and the plurality of upper emitter regions.

22. The device of claim 1, further comprising at least one lower junction formed between the at least one lower base region and the at least one lower emitter region, at least one upper junction formed between the plurality of upper base regions and the plurality of upper emitter regions, an upper-lower junction formed between said at least one lower base region and said plurality of upper base regions; the lower junction, upper junction and upper-lower junctions forming a junction series through which forward current can flow in a latched-on condition, wherein the upper junction, upper surface of the upper portion, first and second conductive contacts and vias enhance current flow uniformity and minimize inductance.

23. The device of claim 1, wherein said first and second metal stripes are substantially perpendicular to said first and second regions.

24. A gate turn-off thyristor device comprising:

an upper portion having a plurality of upper base regions of a second conductivity type, and a plurality of upper emitter regions of a first conductivity type, wherein the a plurality of upper base regions each forms first conductive contacts and the plurality of upper emitter regions each forms second conductive contacts, the first conductive contacts alternating with the second conductive contacts and arranged to form a top upper surface of the upper portion, wherein the top upper surface is a planar surface, and wherein each of said plurality of first conductive contacts and each of said second conductive contacts are parallel to each other from a plan view;

an intermediate layer having first regions of a first metal alternating with second regions of a second metal and non-conductivity regions between the first regions and the second regions, the first regions of said intermediate layer directly connected to the first conductive contacts and the second regions of said intermediate layer directly connected to the second conductive contacts; and, a dielectric layer with a plurality of first openings and a plurality of second openings, a first metal stripe and a second metal stripe, said first metal stripe directly contacting the first regions through the plurality of first openings and said second metal stripe directly contacting the second regions through the plurality of second openings, wherein said first and second metal stripes are substantially perpendicular to said first and second regions, wherein said upper portion and a first conductivity type lower portion formed below the upper portion, form said gate thyristor device.

25. The device of claim 24, wherein the plurality of upper emitter regions each comprises at least one finger having a width of less than 100 microns.

26. The device of claim 24, wherein the upper surface of the plurality of upper base regions each comprises a finger having a width of less than 100 microns.

27. The device of claim 24, wherein the first and second conductive contacts have a combined total width of less than 0.5 cm.

28. The device of claim 24, wherein said upper portion comprises a dense arrangement of upper emitter regions.

29. The device of claim 24, wherein the first and second conductive contacts alternate in a regular repeating form.

30. The device of claim 24, wherein said gate turn-off thyristor turns off a current density of at least 500 A/cm2.

31. The device of claim 24, wherein the plurality of upper emitter regions has a repeating pattern along a cell of good and moderate injection regions, and/or good and moderate contact impedance regions, and/or wider and narrower emitter regions.

32. The device of claim 24, further comprising a controlled thyristor connected to the plurality of upper base regions and providing fast turn on of said gate turn-off thyristor device.

33. The device of claim 24, further comprising an integrated gate controlled transistor connected to the plurality of upper base regions.

34. The device of claim 24, wherein the differential induction between the upper base region and the upper emitter region is less than one percent of the total inductance of said gate turn-off thyristor device.

35. The device of claim 24, wherein the upper surface is level.

36. The device of claim 24, wherein the first conductive contacts and the second conductive contacts form a repeating pattern of at least one of the plurality of first conductive contacts alternating with at least one of the plurality of second conductive contacts.

37. The device of claim 24, wherein the upper portion further comprises at least one enhanced base region of a first conductivity type, the at least one enhanced base region positioned between the plurality of upper base regions and enhancing contact between the plurality of upper base regions and the plurality of upper emitter regions.

38. The device of claim 24, wherein said upper emitter regions have an area of reduced turn off capability.

39. The device of claim 24, further comprising a lid comprising a layer of insulator with upper and lower surfaces, upper metal stripes extending along the upper surface of the insulator, lower metal stripes extending along the lower surface of the insulator, wherein a first one of the lower metal stripes is connected with at least two of the first conductive contacts but not the second conductive contacts, and a second one of the lower metal stripes is connected with at least two of the second conductive contacts but not the first conductive contacts, said lid further comprising conductive vias connecting the upper metal stripes with the lower metal stripes.

40. The device of claim 39, wherein the said first and second ones of the lower metal stripes cross with said upper emitter regions.

41. The device of claim 39, wherein the upper and lower metal stripes are elongated, and the upper metal stripes cross with the lower metal stripes.

42. The device of claim 39, wherein each lower metal stripe contacts at least two of the first and second conductive contacts.

43. The device of claim 39, wherein at least one upper metal stripe connects to one or more electrodes on a control device mounted on said lid.

44. The device of claim 39, wherein a control device is mounted on said lid, the control device controlling said gate turn-off thyristor device.

45. The device of claim 39, wherein said device establishes a substantially uniform current path from the first or second upper metal stripes of said lid via said upper portion to the respective lower base region or lower emitter region of said lower portion.

46. A gate turn-off thyristor device comprising:

an upper layer having a base region and emitter regions, wherein the base region and the emitter regions form a top surface at which said emitter regions are on opposite sides of said base region, wherein the top surface of the base region and said emitter regions is a planar surface, wherein said base region and each of said emitter regions are parallel to each other from a plan view;

an intermediate layer having first conductive contacts alternating with second conductive contacts, wherein each of the first conductive contacts and said second conductive contacts comprise a narrow elongated stripe, each of said first conductive contacts is directly connected to said base region, and each of said second conductive contacts is directly connected to a respective one of said emitter regions;

a dielectric layer with a plurality of first openings and a plurality of second openings; and, a first metal stripe and a second metal stripe, said first metal stripe directly contacting the first conductive contacts through the first openings and said second metal stripe directly contacting the second conductive contacts through the second openings, wherein said first and second metal stripes are substantially wider than said first and second conductive contacts, wherein said upper layer and a first conductivity type lower layer formed below the upper layer form said gate turn-off thyristor device.

47. The device of claim 46, wherein said first and second metal stripes are substantially perpendicular to said first and second conductive contacts.

48. The device of claim 46, wherein each of said emitter regions of said upper layer have an area of reduced turn off capability.

49. The device of claim 46, further comprising a lid having a second insulator layer with first and second upper metal stripes extending along an upper surface of the insulator layer, first and second lower metal stripes extending along a lower surface of the insulator substantially perpendicular to the first and second upper metal stripes, and conductive vias connecting the first and second upper metal stripes with the first and second lower metal stripes, whereby the first and second lower metal stripes are in contact with and are substantially thicker than the first and second metal stripes of said dielectric layer.

50. The device of claim 49, wherein said device establishes a substantially uniform current path from the first or second upper metal stripes of said lid via said first insulator layer and said dielectric layer to the respective base region or emitter regions of said upper layer.

51. The device of claim 46, wherein the upper layer further comprises an enhanced base region, the enhanced base region enhancing contact between the base region and the plurality of emitter regions.

* * * * *